United States Patent
Sapir

(10) Patent No.: US 8,040,022 B2
(45) Date of Patent: Oct. 18, 2011

(54) FORCED VIBRATION PIEZO GENERATOR AND PIEZO ACTUATOR

(75) Inventor: Itzhak Sapir, Irvine, CA (US)

(73) Assignee: Aprolase Development Co., LLC, Wilmington, DE (US)

( * ) Notice: Subject to any disclaimer, the term of this patent is extended or adjusted under 35 U.S.C. 154(b) by 397 days.

(21) Appl. No.: 12/334,383

(22) Filed: Dec. 12, 2008

(65) Prior Publication Data
US 2009/0167114 A1  Jul. 2, 2009

Related U.S. Application Data

(60) Provisional application No. 61/007,497, filed on Dec. 12, 2007.

(51) Int. Cl.
*H02N 2/18* (2006.01)
(52) U.S. Cl. .......... 310/339; 310/311; 310/331
(58) Field of Classification Search ........ 310/331, 310/339, 311
See application file for complete search history.

(56) References Cited

U.S. PATENT DOCUMENTS

| | | | | |
|---|---|---|---|---|
| 4,442,372 A * | 4/1984 | Roberts | ...... | 310/339 |
| 4,752,053 A * | 6/1988 | Boetzkes | ...... | 246/167 R |
| 6,011,346 A * | 1/2000 | Buchanan et al. | ...... | 310/339 |
| 6,424,079 B1 * | 7/2002 | Carroll | ...... | 310/339 |
| 7,246,660 B2 * | 7/2007 | Fripp et al. | ...... | 166/65.1 |
| 2002/0043895 A1 * | 4/2002 | Richards et al. | ...... | 310/328 |
| 2005/0280334 A1 * | 12/2005 | Ott et al. | ...... | 310/339 |

\* cited by examiner

Primary Examiner — Walter Benson
Assistant Examiner — Bryan Gordon

(57) ABSTRACT

Piezoelectric elements for power generation and/or actuation are described. An aspect is directed to generators utilizing piezoelectric elements for electrical power generation. Such a generator can use one or more arrays of piezoelectric cantilevers for electrical power generation in conjunction with modulated air pressure used for exciting the cantilevers. The pressure level/modulation and cantilever area can be controlled variables for maximizing the bending, and hence energy generation, of the cantilevers. A further aspect is directed to hydraulic fluid actuators utilizing a pumping mechanism that includes a piezoelectric element. The linear actuators can advantageously utilize the high force and high frequency characteristics of a piezoelectric membrane in conjunction with a large stroke and actuation direction conversion afforded by hydraulic transmission.

37 Claims, 11 Drawing Sheets

FORCED VIBRATION PIEZO GENERATOR AND PIEZO ACTUATOR

RELATED APPLICATION

This application claims the benefit of U.S. Provisional Patent Application Ser. No. 61/007,497, entitled "Forced Vibration Piezo Generator," filed 12 Dec. 2007, the entire contents of which are incorporated herein by reference.

BACKGROUND

Power generating devices that harvest energy from natural environments are widely researched and devices that provide "free" energy are always desired. The concept and technology for generating electrical power from vibrating piezoelectric ("piezo") cantilever beams is known and is in use for power harvesting in vibrating environments. In these devices, an array of piezo cantilever beams is fabricated on a substrate, usually using thin film micro-electromechanical systems ("MEMS") processes, and a small proof mass is deposited or otherwise attached to the free end of each beam. As the device holding the substrate vibrates, the cantilevers start vibrating at their natural frequency (resonate) with the proof mass being the element that induces the bending force on the beam. The piezo cantilever beams are constructed in a way that when they bend, an electrical voltage is generated between the top and bottom surfaces, and when connected to an electrical circuit, electrical current develops. Such devices use vibration from the environment as their energy source and the magnitude of the cantilevers' bending and electrical energy produced is limited by the energy in this vibration and the geometry of the beams, mainly their cross section and weight of proof mass. Since in most cases of energy harvesting from vibration, the available energy is not very high and since the proof mass (comparing to the stiffness of the beams) is not large, the bending of the piezo beams is small and the amount of energy produced is also not high.

Power generation using compressed air is also a known technique. Typical air pressure power generators use the air's kinetic energy as a means to rotate some kind of turbine that in turn rotates an electromagnetic generator. This kind of air pressure generators require high pressure levels and are relatively big and heavy. They also have inherent startup losses due to the need to accelerate the moving masses before power is generated.

In the area of actuating devices, or actuators, for some MEMS based applications such as fluidic microchannel chip cooling devices, a high-force, large-stroke high-frequency actuator is required. Current actuators in the MEMS world do not meet these three high performance requirements. As a result the desired performance of the device cannot be met.

There are several MEMS based linear actuator technologies. The most common one is the electrostatic comb-drive actuator that delivers large-stroke actuation at high frequencies but with limited force and with limitations on its size that reduce scalability potential to larger force actuators. On the other side of the spectrum is the thermal actuator that delivers large stroke and high force at a very low frequency. Other actuation technologies include stacked piezo layers (high force and frequency and very small stroke. Not really a MEMS actuator), Piezo membrane (high force and small stroke) and others. None of the existing known actuators deliver the combination of these three performance characteristics.

While the prior art techniques may prove suitable for certain intended uses, for other applications such techniques can be subject to limitations.

SUMMARY

The present disclosure is directed to techniques, including devices, apparatus, methods, and systems that address deficiencies note for the prior art. Aspects/embodiments of the present disclosure can utilize piezoelectric elements for power generation and/or displacement or position control (actuation).

An aspect of the present disclosure is directed to generators utilizing piezoelectric elements for electrical power generation. Such generators can utilize one or more arrays of piezoelectric cantilevers in conjunction with modulated fluid pressure used for exciting the cantilevers for electrical power generation. The pressure level/modulation and cantilever area can be controlled variables, allowing for maximizing the bending, and hence energy generation, of the cantilevers. In exemplary embodiments, the pressure modulation frequency is designed to match the designed resonance frequency of the beams in order to achieve best/optimal energy conversion efficiency.

An exemplary embodiment of a piezoelectric generator according to the present disclosure can include a generator plate comprising a plurality of piezoelectric cantilevers. The generator can also include an inlet and valving plate including an inlet for receiving fluid and an aperture for passing fluid to the generator plate. An exhaust plate can be present that includes an exhaust aperture configured and arranged to receive fluid from the generator plate. The generator plate can include a piezoelectric membrane configured and arranged to receive an electrical signal and in response modulate pressure of a fluid provided from the aperture to the plurality of piezoelectric cantilevers.

A further embodiment can include a system of stacked piezoelectric generator modules and a throttle piston configured and arranged for being disposed within the inlet of each generator module to be throttled for selectively opening or blocking the flow groove of the individual generator modules.

A further aspect of the present disclosure is directed to hydraulic (fluid) actuators utilizing a pumping mechanism that includes a piezoelectric element. The linear actuators can advantageously utilize the high force and high frequency characteristics of a piezoelectric membrane in conjunction with a large stroke and actuation direction conversion afforded by hydraulic transmission.

An exemplary embodiment of a piezohydraulic linear actuator in accordance with the present disclosure can include (i) a housing including a fluid reservoir, (ii) a piezoelectric element actuator including a moveable membrane supported on a surface adjacent the fluid reservoir and a piezoelectric element supported by the membrane, wherein the piezoelectric element is configured and arranged to undergo deformation out of the plane of the membrane in response to an applied electric field, and (iii) a movable surface coupled to the fluid reservoir.

Other features and advantages of the present disclosure will be understood upon reading and understanding the detailed description of exemplary embodiments, described herein, in conjunction with reference to the drawings.

BRIEF DESCRIPTION OF THE DRAWINGS

Aspects of the present disclosure may be more fully understood from the following description when read together with the accompanying drawings, which are to be regarded as illustrative in nature, and not as limiting. The drawings are not necessarily to scale, emphasis instead placed on the principles of the disclosure. In the drawings.

Figure 1:
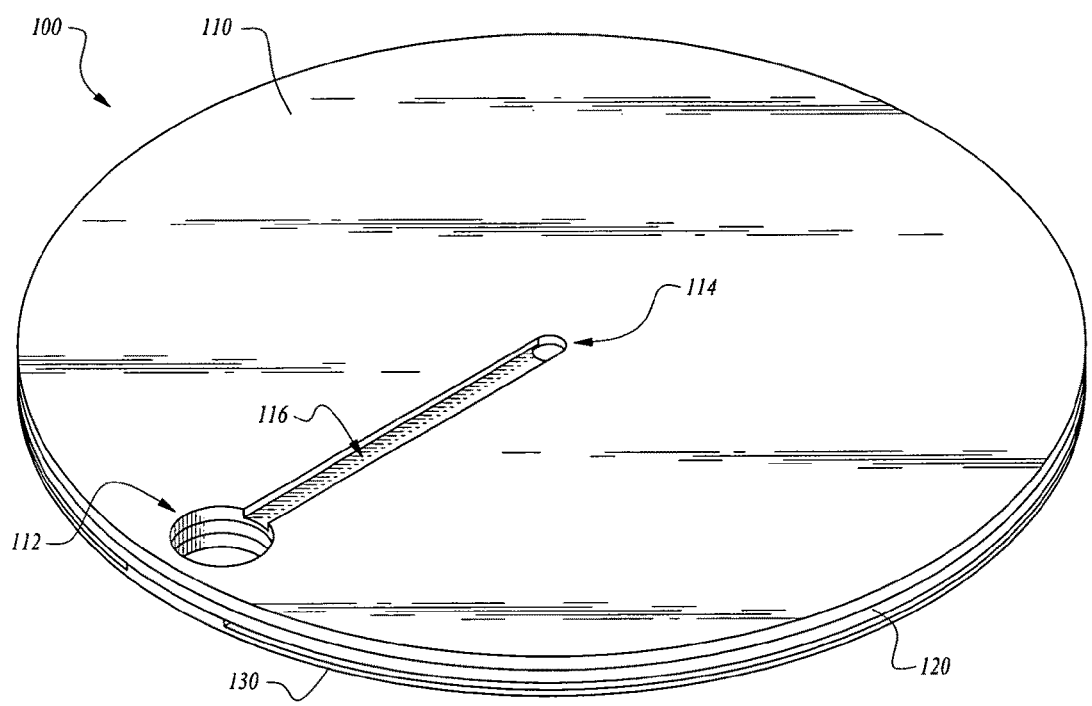
FIG. 1 depicts a diagrammatic perspective view of a forced vibration piezoelectric generator ("FVPG") module in accordance with an exemplary embodiment of the present disclosure.

While certain embodiments depicted in the drawings, one skilled in the art will appreciate that the embodiments depicted are illustrative and that variations of those shown, as well as other embodiments described herein, may be envisioned and practiced within the scope of the present disclosure.

DETAILED DESCRIPTION

The present disclosure is, in general terms, directed to techniques, including devices, apparatus, systems, and methods for power generation and/or displacement control (actuation) for small scale (e.g., MEMS) devices and systems. Exemplary embodiments can utilize piezoelectric elements.
Forced Vibration Piezo Generators An aspect of the present disclosure is directed to generators utilizing piezoelectric elements/materials for electrical power generation. Such a generator can use one or more arrays of piezoelectric cantilevers for electrical power generation in conjunction with modulated fluid pressure used for exciting the cantilevers. As used herein, "fluid" can include reference to a liquid or a gas, though exemplary embodiments are described in the context of the fluid being air. Embodiments of harvesting devices of the present disclosure that use low pressure, low kinetic energy pressurized air can potentially replace large and expensive wind turbines that only work at strong winds areas and are aimed only at the high power applications.

Such generators can utilize one or more arrays of piezoelectric cantilevers, or "piezo cantilever arrays," for electrical power generation. Instead of using a proof mass and excitation by external vibration (as in prior art vibration energy harvesting devices), such generators can use forced and/or modulated air pressure as the means for exciting the cantilevers. In exemplary embodiments, a piezoelectric membrane can be controlled to modulate the pressure of air (or other fluid) sent to the piezo cantilever arrays. The pressure level and cantilever area can be controlled variables for maximizing the bending, and hence energy generation, of the cantilevers. Accordingly, such generators are sometimes referred to herein as forced vibration piezoelectric generators ("FVPGs"), In exemplary embodiments, the pressure modulation frequency provided, e.g., by a piezo membrane, is designed to match the designed resonance frequency of the cantilever beams in order to achieve best energy conversion efficiency.

Such FVPG systems can be considered pure pressure systems as they utilize the pressure differential between pulsating air and the ambient air pressure to bend the cantilever beams. Because of this reason, the FVPG system can produce energy even at low air pressure levels and low flow rate. The flow rate is proportional to the number of beams operated (which can be controlled as will be explained below) and the resonance frequency designed into the beams. Because pressure uses the area of the beam for creating a bending force, the actual bending forces on a cantilever beam from a relatively low pressure are much larger than any vibration induced forces with typical proof mass and environment vibration levels. Also, a vibration energy harvesting device only captures the vibration energy at a frequency that coincides with the piezo cantilevers' resonance frequency. The remaining vibration energy is lost.

Pressurized air can come from different sources including manual pumps (e.g., a small manual pump to pressurize a small air tank), an intake manifold in a moving vehicle (an unmanned aerial vehicle "UAV" that uses an engine for flying but needs an electrical power source for powering its payload) or wind (similar to the UAV application where the intake manifold is placed in a windy environment). Although in all of these examples the kinetic energy may not be very high, a pressure differential is created that can be used in FVPGs according to the present disclosure.

In exemplary embodiments of the present disclosure, a FVPG preferably (though not necessarily) modulates air pressure to the resonance frequency of the cantilever beams so most of the energy stored in the air pressure will be used to excite the beams. An exemplary embodiment described below presents a FVPG configuration that allows control of the amount of electrical energy generated with different levels of air pressure and flow by providing a stacked configuration of FVPGs in conjunction with a throttle bore.

FIG. 1 depicts a diagrammatic perspective view of the basic building block of a FVPG generator module 100 in accordance with exemplary embodiments of the present disclosure. Module 100 consists of three plates bonded/configured adjacent to one another: an air inlet and valving plate 110, a generator plate 120, and an exhaust plate 130.

Figure 2:
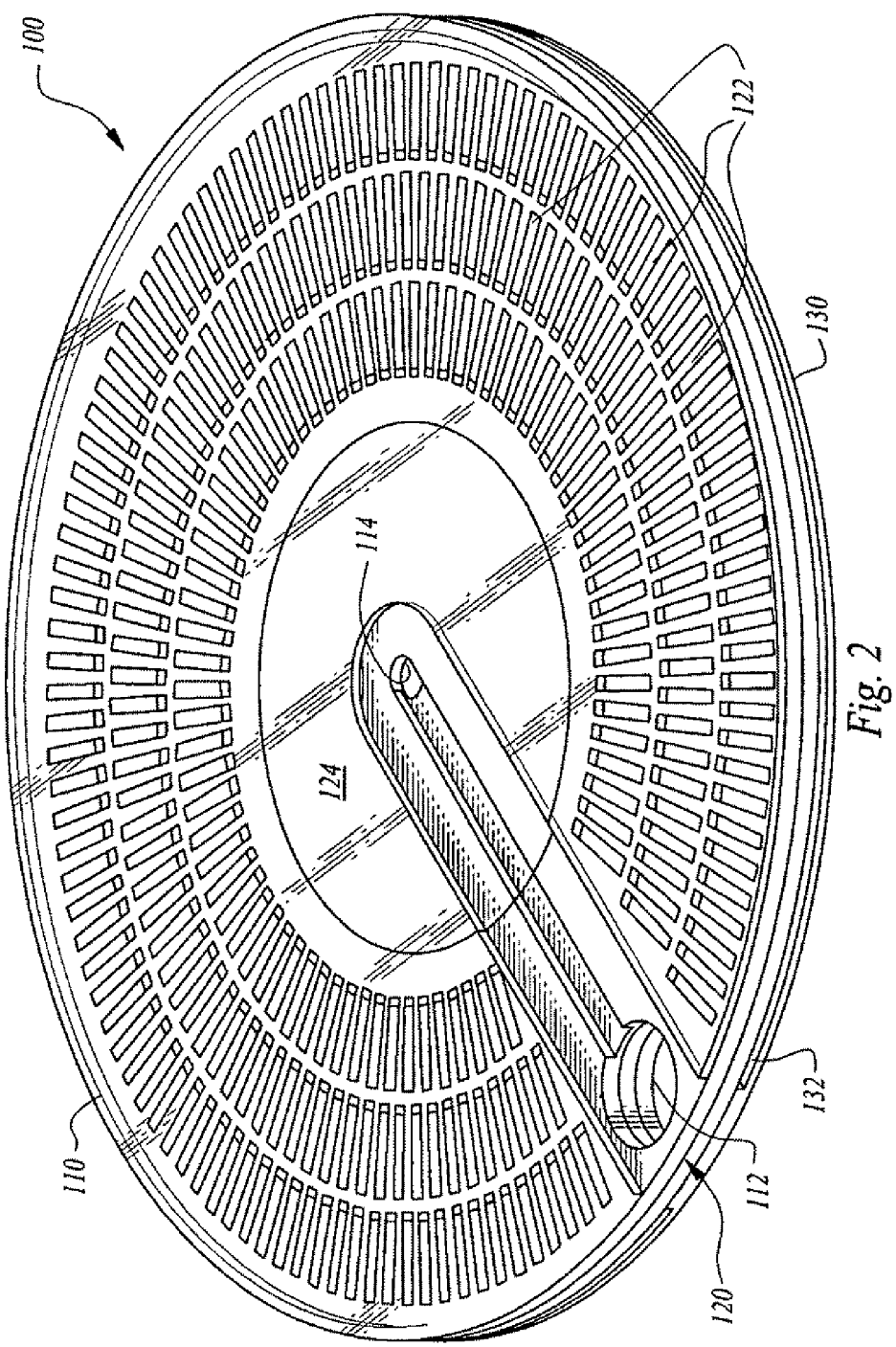
FIG. 2 depicts the generator module of FIG. 1 with transparent inlet and valving plate.

With continued reference to FIG. 1, close to the edge of the module 100 there is an aperture or inlet hole 112 that is used as the air inlet path to the module 100. In exemplary embodiments, inlet 112 can pass through the generator plate 120 and exhaust plate 130, as will be described. As shown, the air inlet and valving plate 110 can include a small hole 114 in the center and a groove 116 on its top side that connects this hole 114 to the inlet hole 112. The generator plate 120 can include one or more (preferably many) piezo cantilevers, e.g., configured concentric arrays residing around a central piezo membrane (as shown in FIG. 2). The exhaust plate 130 includes ports or exhaust passages that allow air to pass from the generator plate 120 to outside the module 100.

In exemplary embodiments, the generator plate 120 can be made from silicon and the piezo cantilevers and central piezo membrane can be fabricated using a thin-film fabrication processes, e.g., sputtering or sol gel processes. Suitable piezo materials for the cantilevers and/or membrane can include, but are not limited to, zinc oxide, barium titanite, lead titanite, lead zirzirconate titanate, lead lanthanum zirconate titanate, lead magnesium niobate, potassium niobate, potassium sodium niobate, and/or potassium tantalite niobate, among others. Piezoelectric polymers may be used in exemplary embodiments of the present disclosure.

FIG. 2 depicts the piezo generator module 100 of FIG. 1 with transparent inlet and valving plate 110. As previously described, the generator plate 120 can include a plurality of piezo cantilevers 122. The cantilevers 122 are preferably configured as concentric circular arrays. The generator plate 120 can include a central membrane 124 that is configured to act as a modulating valve for air coming through the central hole 114 in the inlet and valving plate 110. In alternate embodiments, the central membrane 124 can be connected to or integral with the inlet and valving plate 110. Suitable electrical connections or electrodes are included (not shown) for causing actuation/movement of the central membrane 124 and also to receive electrical power generated from the cantilevers 122 as they move; such electrical connections/electrodes may be separate for each different function.

With continued reference to FIG. 2, as the valve membrane 122 is actuated up and down, it moves towards and away from the valve hole 114, opening and closing it thus modulating the air flow. Pressurized air pulses move into the volume above the cantilever beams 122 and apply bending forces or loading profiles on them. As the beams 122 bend they create an electrical response due to their piezoelectric nature. Also, as the beams bend, the air passes through the small gaps 126 that open between the beams 122 and the plate 120 (shown in FIG. 3) and enters an exhaust port or volume 132. This volume 132 can be a gap created by the exhaust plate 130. The air passes through the exhaust volume 132 to be released outside of the module, e.g., into a manifold or the ambient air.

Figure 3:
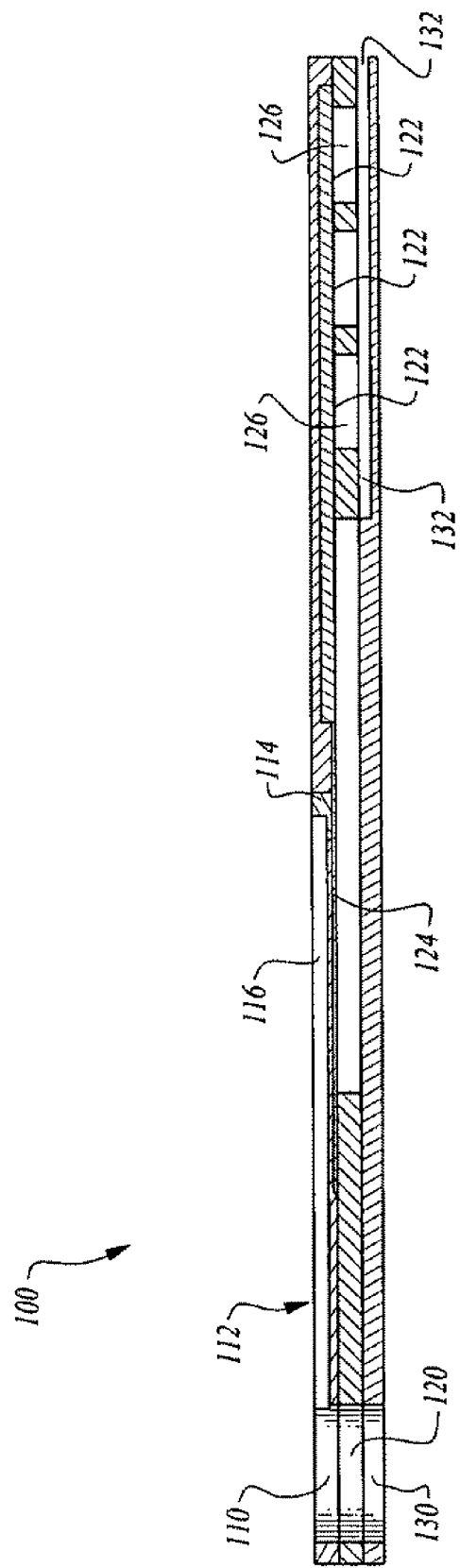
FIG. 3 shows a cross section of the generator module of FIGS. 1-2.

FIG. 3 shows a cross section of the generator module 100 of FIGS. 1-2. The beams 122 and membrane 124 are shown as a thin layer on the top side of the generator plate 120. When bonded together, the membrane 124 makes contact with the valve hole (zero gap) but it is free to move back, e.g., in response to an applied voltage. As the membrane 124 moves, a gap opens to allow air to flow in a radial direction to the volume above/surrounding the piezo cantilever beams 122. As the beams 122 bend, the air passes through the small gaps 126 that open between the beams 122 and the plate 120, producing electrical energy that can be harvested, e.g., through appropriate electrical connections. The fluid (e.g., air or other gas) then enters an exhaust port or volume 132 in the exhaust plate 130.

When the membrane 124 moves towards the hole 114, the membrane 124 presses against the hole 114 and completely shuts the flow of air into the generator plate 120. Since the diameter of the membrane 124 can be much larger than the diameter of the valve hole 114, and since the blocking force of a piezo element can be relatively high, the valving force of the membrane 124 can be higher than the force generated by the pressurized air even at high pressure levels. The FVPG 100 can be designed in this way with the expected pressure of the specific application in mind.

The pressure at different concentric beam arrays drops for further arrays due to the release of air in previous concentric arrays. This can dictate the number of concentric arrays that can generate power in one generator module. Depending on the performance goals and available air pressure, the number of concentric arrays can vary from one to several.

One skilled in the art will understand that while an exemplary embodiment of implementing a FVPG is described with regard to FIGS. 1-3, other embodiments and implementation methods are within the scope of the present disclosure and can also utilize the basic concept of forced vibration of piezo cantilever beams through modulation of air pressure.

Figure 4:
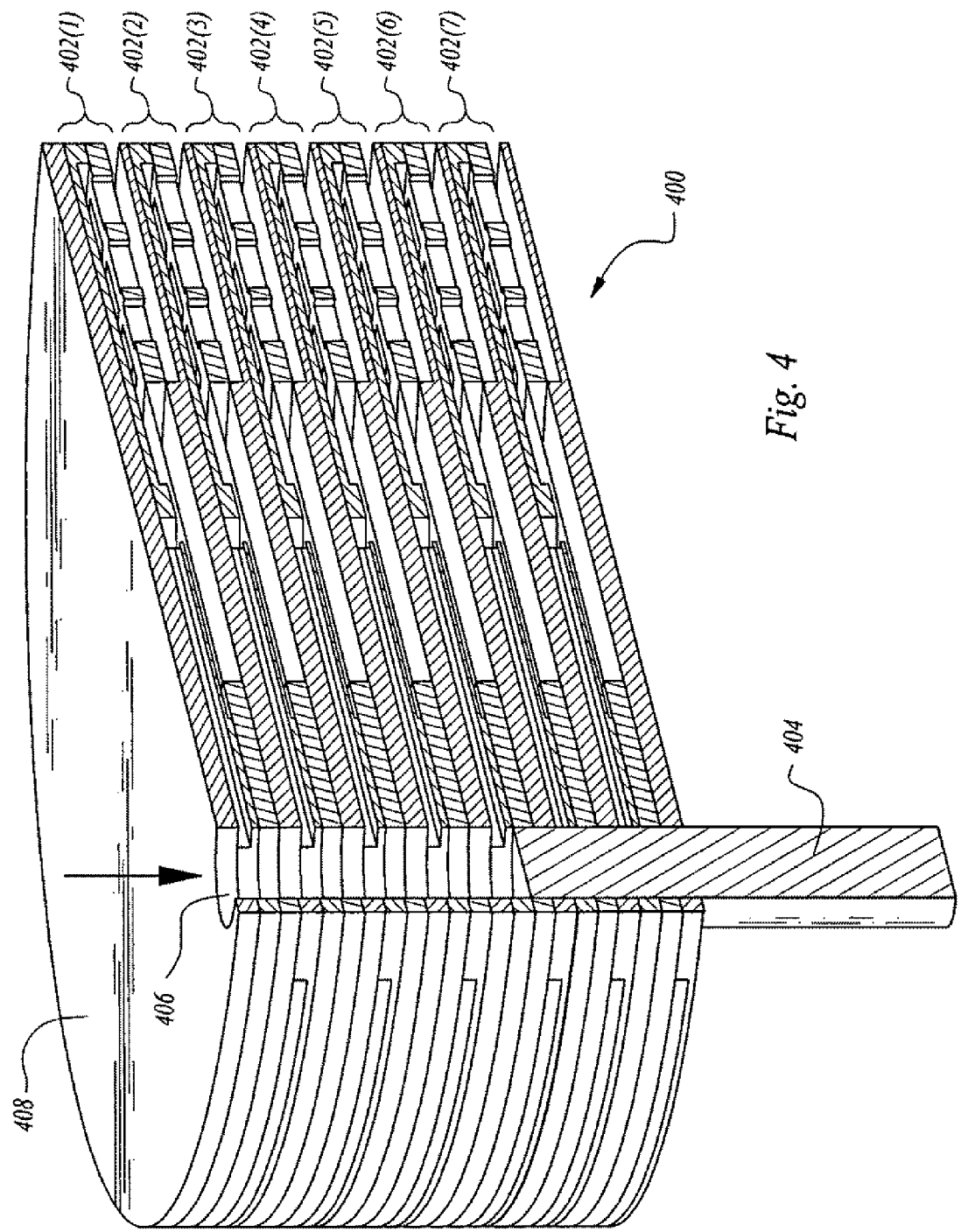
FIG. 4 depicts a diagrammatic cross section of a seven layer FVPG stack, in accordance with an exemplary embodiment of the present disclosure.

FIG. 4 depicts a cross section of a system 400 of stacked FVPGs in accordance with an exemplary embodiment of the present disclosure. As shown, system 400 can include multiple FVPG modules 402 stacked together, e.g., the seven FVPGs 402(1)-402(7). A throttle piston 404 is configured and arranged to move up and down in an air pressure inlet hole 406 that is shared by the stacked FVPGs 402(1)-402(7). By such a configuration, the throttle piston 404 can be throttled to selectively open or block the flow grooves in the individual modules 402(1)-402(7) in a sequential manner. The piston 404 can move from a closed position (no power generated, no air consumed) to a full open position, and through a range of positions in between the two extremes. In exemplary embodiments, the actuation of the respective membrane valves can also be controlled by the relative position of the throttle piston 404 so that no membrane will be actuated when no air is supplied to the corresponding module 402.

With continued reference to FIG. 4, in exemplary embodiments, the piston 404 can be automatically controlled (by available pressure for example) to adjust the electrical power generation (and air consumption) to the amount of available air. The piston 404 can also (or in the alternative) be controlled in an open (or closed) control loop (manually or otherwise) to increase or decrease the electrical power generation in cases where enough air pressure is available.

In an exemplary embodiment, two loaded cantilever beam cases were analyzed using the Comsol MultiPhysics simulation program. A 50 μm thick piezo beam (PZT-5H), 1 mm wide and 2.5 mm long was loaded with two different loads. The first case illustrates a vibration energy harvesting piezo beam typical of the prior art. A 0.5 mm long×1 mm wide×0.5 mm thick proof mass was mounted at the end of the beam in the simulation and a 1 g acceleration load was applied. The proof mass was modeled as being made from the same material and its mass was 1.875 e-6 Kg. The end force for 1 g was 18.375 e-6N. The maximum deflection for this case was shown to be 4.5 e-8 m or 0.045 μm.

The second case illustrates the simulation results of a pressure of 0.05 atm applied to the top surface of the beam in accordance with an embodiment of the present disclosure. The maximum deflection for this load was shown to be 1.1 e-5 m or 11 μm, which displacement is between two and three orders of magnitude (244×) than the displacement calculated for the case for the simulated proof mass.

Both loads illustrated for the above-described simulations were relatively small loads. A load resulting from 1 g can be obtained from relatively mild vibration environments and pressure buildup of 0.05 atm is easily obtained using manual pump or designing a Pitot type compressor in a moving vehicle. Still in these two mild load cases the pressure based case produced approximately 250 times larger deflection. As the voltage generated by a piezo cantilever beam is proportional to the deflection and for a fixed geometry, the larger the deflection the higher the voltage and total power. Accordingly, FVPGs systems/modules of the present disclosure can offer advantages over prior art power generators.

Linear Actuators

A further aspect of the present disclosure is directed to hydraulic (fluid) linear actuators utilizing a pumping mechanism that includes a piezoelectric, electromagnetic, or electrostatic actuating element. Exemplary embodiments of the linear actuators can advantageously utilize the high force and high frequency characteristics of a piezoelectric membrane in conjunction with a large stroke and actuation direction conversion afforded by hydraulic transmission. Such actuators can fit into MEMS devices that require high-force large-stroke actuation both in low and more uniquely high frequency applications.

Figure 5:
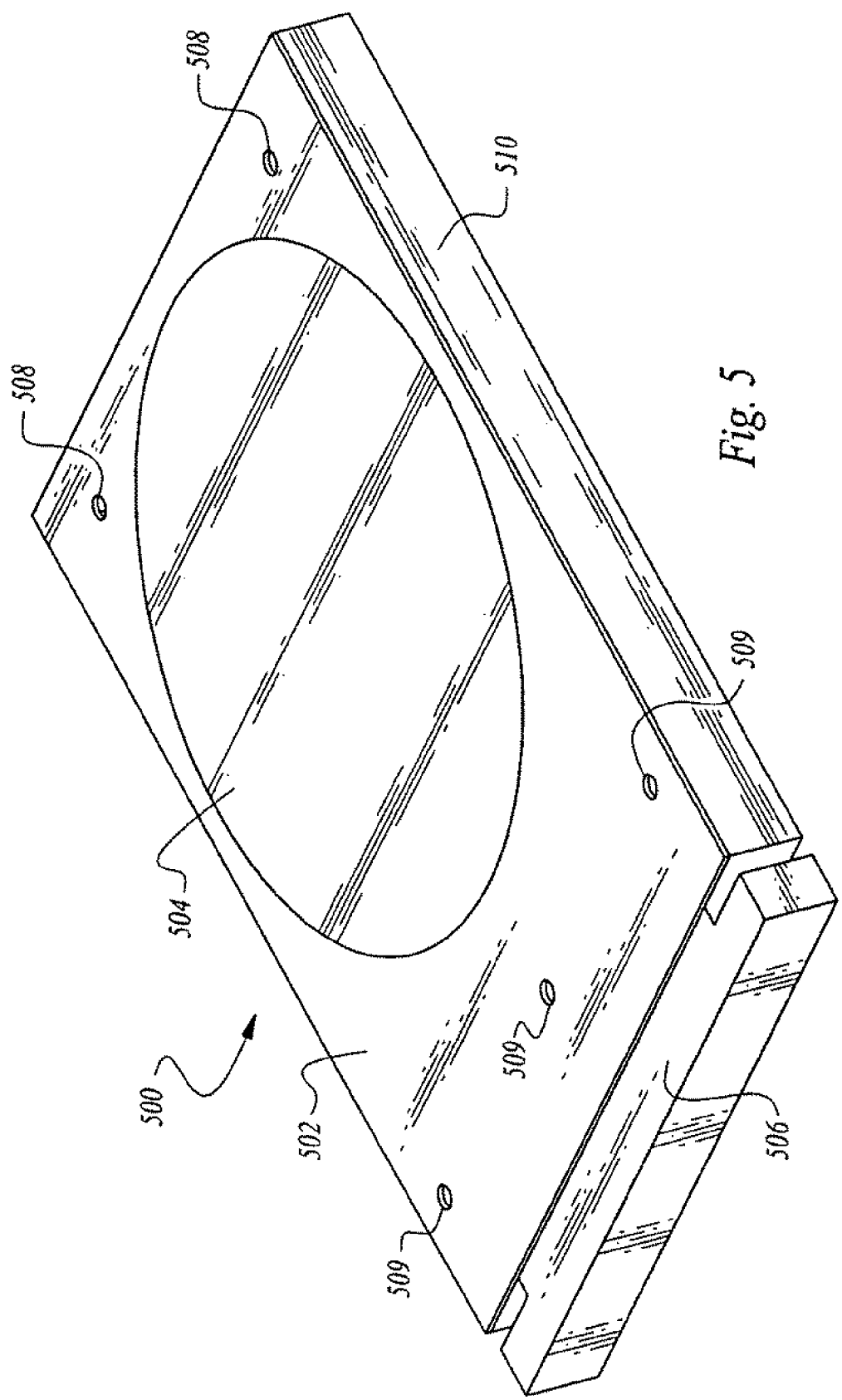
FIG. 5 depicts a diagrammatic perspective view of a piezohydraulic actuator with a moving shuttle and viscous material seal, in accordance with a further embodiment of the present disclosure.

FIG. 5 depicts a diagrammatic perspective view of a piezohydraulic linear actuator 500, in accordance with a further embodiment of the present disclosure. As shown in FIG. 5, the piezohydraulic actuator 500 can include a housing and a piezoelectric actuator element 504. The actuator 500 also includes a moving surface, e.g., shuttle 506. A viscous material seal (not shown) can be included within the actuator 500. The piezoelectric element actuator 504 component can includes a substrate, e.g., silicon or metallic, on which a piezo material disk is either deposited or otherwise attached. Housing 502 can include holes or apertures, e.g., holes 508 for hydraulic fluid filling and/or holes 509 for viscous fluid filling. In exemplary embodiments piezoelectric element 504 can be configured as a disk. Of course, while actuator element 504 is described as being a piezoelectric element actuator, in alternative embodiments, it may be or include a suitable electromagnetic or electrostatic actuating element.

The mode of operation for the piezoelectric element actuator 504 is bending in and out of the static plane of the element 504 (disk). For such operation, an included piezo disk (shown as the top surface 504 in FIG. 5) expands and contracts in the radial direction when subjected to a voltage difference in the thickness direction, e.g., as applied by suitable electrodes/electrical connections. As a result of this expansion and contraction a non-symmetrical force is applied on the substrate material and bending occurs. The force in the direction perpendicular to the disk plane (blocking force) of such devices is relatively high. For example, a disk that consists of a piezo crystal layer laminated on a brass substrate can produce more than 2 Newtons of force with the center deflection proportional to the disk diameter. The piezo membrane/disk can be fabricated using a thin-film fabrication processes, e.g., sputtering or sol gel processes. Suitable piezo materials for the membrane/disk can include, but are not limited to, zinc oxide, barium titanite, lead titanite, lead zirzirconate titanate, lead lanthanum zirconate titanate, lead magnesium niobate, potassium niobate, potassium sodium niobate, and/or potassium tantalite niobate, among others. Piezoelectric polymers may be used in exemplary embodiments of the present disclosure.

Figure 8:
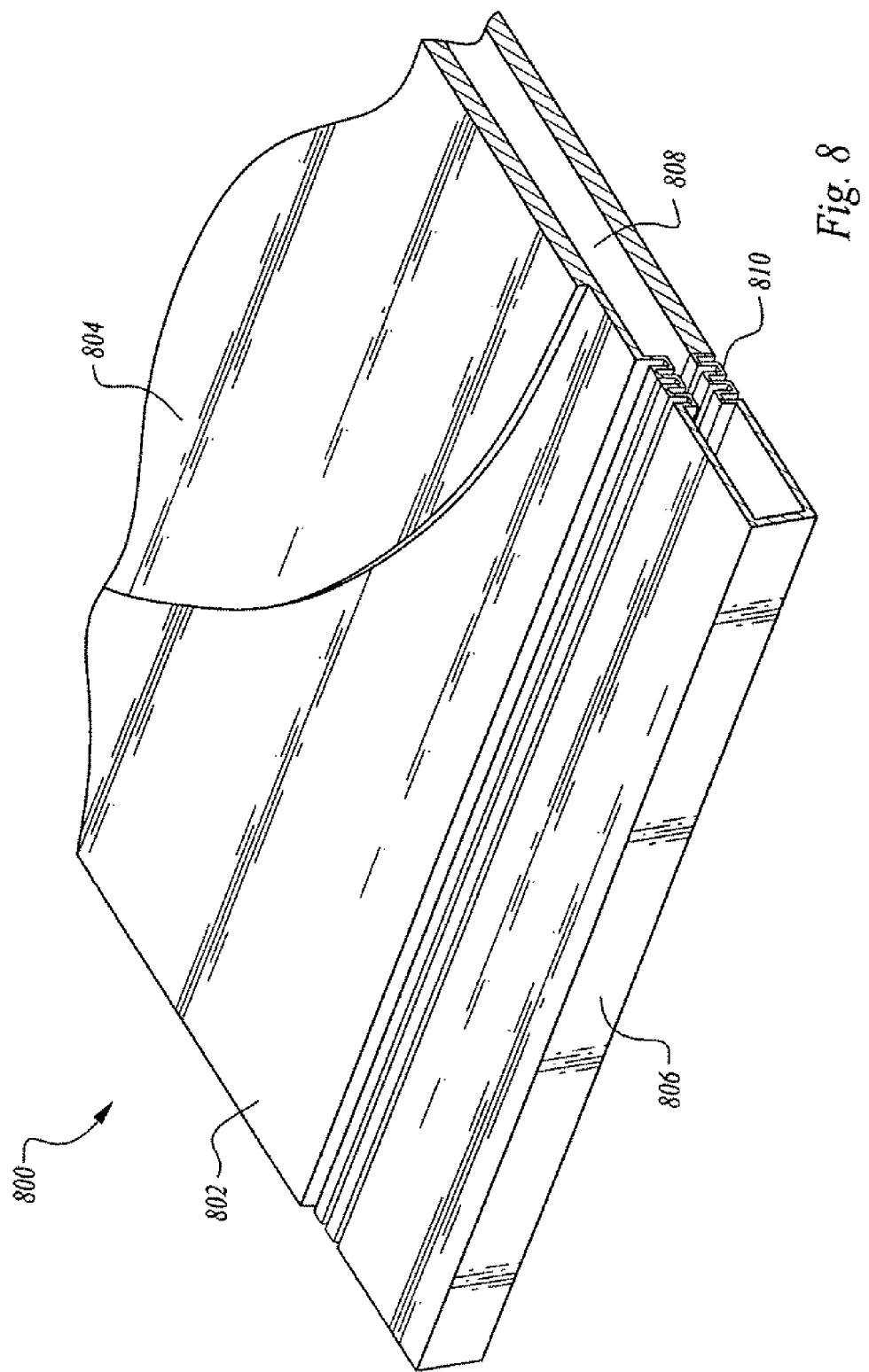
FIG. 8 depicts a diagrammatic perspective view with cross section of a piezohydraulic actuator with a bellows wall design, in accordance with exemplary embodiments of the present disclosure.

As previously described, the piezo disk actuator 504 can be mounted on housing 502, which can be constructed in a way that all its side walls, e.g., wall 510 and the wall opposite to the piezo disk are rigid and one wall is flexible or includes a movable surface, e.g., fluidically coupled to shuttle 506 by way of a viscous fluid, to produce controlled linear actuation. The flexible design can be achieved in a number of ways including a bellows wall, a piston-like slide with sealing means and a shuttle on flexures, again with sealing means. FIG. 5 shows a shuttle 506 configured as a piston-like slide while FIG. 8 shows a bellows wall embodiment.

Stroke enhancement for the actuator 500 can be achieved by designing the ratio between the disk area and piston (or shuttle or bellows wall) area in a way that the small disk deflection displaces a volume of hydraulic fluid that produces a large piston movement. The actuation direction conversion is achieved by making the flexible wall one of the side walls of the housing 502. For alternate embodiments, if no direction conversion is needed, the wall in front of the disk can be the actuation wall with a different pressure area (most of the wall rigid with a small flexible part or a piston in it.

The design of the piezohydraulic actuator 500 allows for great design flexibility capable of producing a large set of force/stroke combinations. The design parameters include the disk size and original force and stroke parameters and the piston pressure area. In addition, the design of the actuator 500 is easily scalable to larger strokes and forces for various embodiments, for example as shown and described for FIGS. 6-11 herein.

Figure 6:
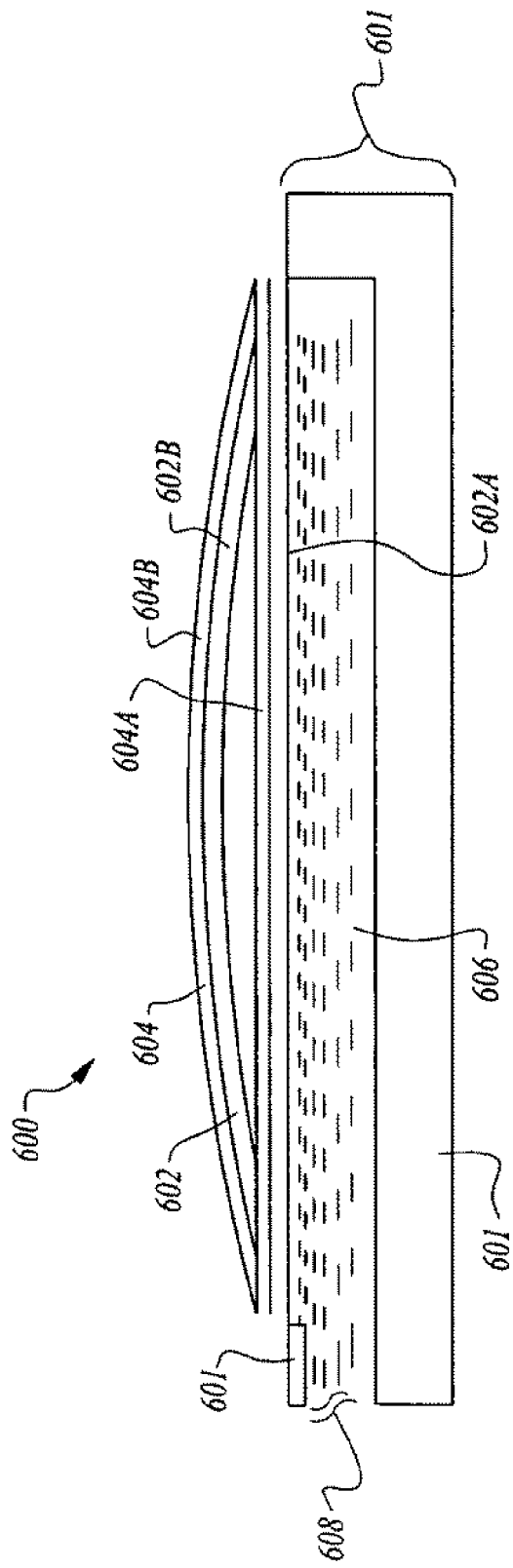
FIG. 6 depicts a schematic view of a cross section of a piezohydraulic actuator showing mounting of the piezoelectric element and its mode of deflection, in accordance with exemplary embodiments of the present disclosure.

FIG. 6 depicts a schematic view of a cross section of a portion of piezo actuator 600, in accordance with exemplary embodiments of the present disclosure. As shown in FIG. 6, actuator 600 can include a housing 601 and a substrate 602 supporting a piezo disk 604. The mode of deflection of the coupled substrate 602 and piezo disk 604 are indicated by the positions 602A, 604A and 602B, 604B, respectively. When the disk 604 vibrates in response to an applied voltage (field), displaced hydraulic fluid 606 can be utilized for linear actuation, e.g., fluid moving through channel 608 can push and pull a connected shuttle or bellows.

Figure 7:
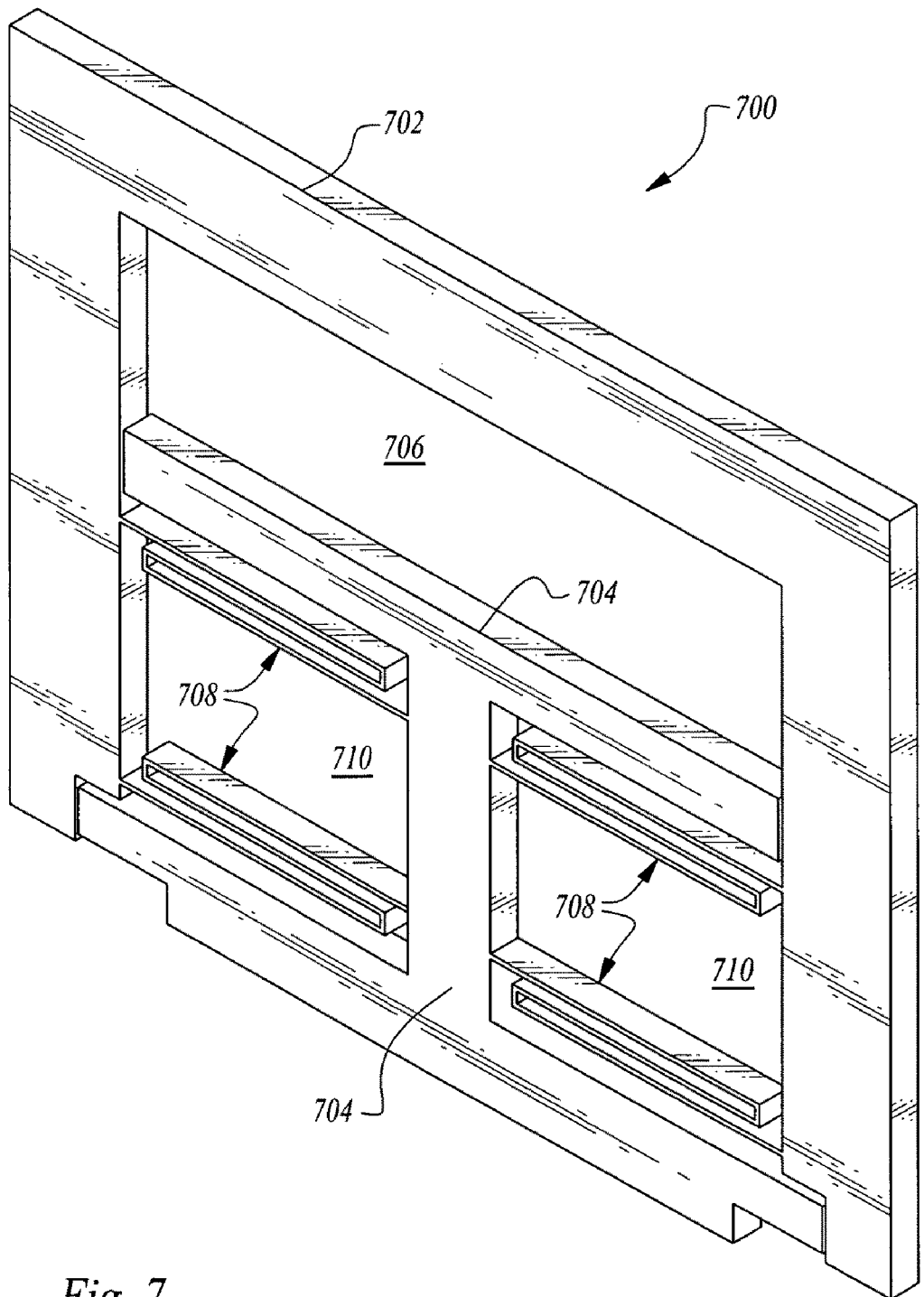
FIG. 7 depicts a diagrammatic perspective view of a shuttle layer for a piezohydraulic actuator, in accordance with an embodiment of the present disclosure.

FIG. 7 depicts a perspective view of a shuttle layer 700 for a piezo actuator in accordance with an embodiment of the present disclosure. A suitable actuator includes the shuttle layer 700 with housing 702 and movable shuttle 704, and additional top and bottom layers (not shown) that constitute the hydraulic chamber and piezo disk membrane support. A piezo disk, e.g., disk 604 of FIG. 6, would be attached to a membrane support on the top layer to form an operational piezohydraulic actuator according to the present disclosure.

Continuing with the description of FIG. 7, shuttle 704 has a "H" shape. One side/surface of shuttle 704 and the housing 702 form a hydraulic chamber suitable for holding hydraulic fluid, e.g., operated on by a piezo disk/membrane. Another side/surface of shuttle 704 can form or be linked to an actuation surface.

In exemplary embodiments, layer 700 can include flexures 708, e.g., serpentine elements as shown, so as to provide/facilitate a spring functionality to shuttle 704. Also, layer 700 can include a viscous fluid within chambers 710 for similar purposes.

FIG. 8 depicts a perspective view with cross section of a piezohydraulic actuator 800 with a bellows wall design, in accordance with exemplary embodiments of the present disclosure. Actuator 800 is similar to piezohydraulic actuator 500 if FIG. 5, and includes a housing 802 on which is mounted a piezo actuator disk 804. The housing forms a reservoir 808 for holding a hydraulic fluid and includes a moveable surface 806. Instead of a shuttle or piston, however, actuator 800 includes a bellows portion 810.

Figure 9:
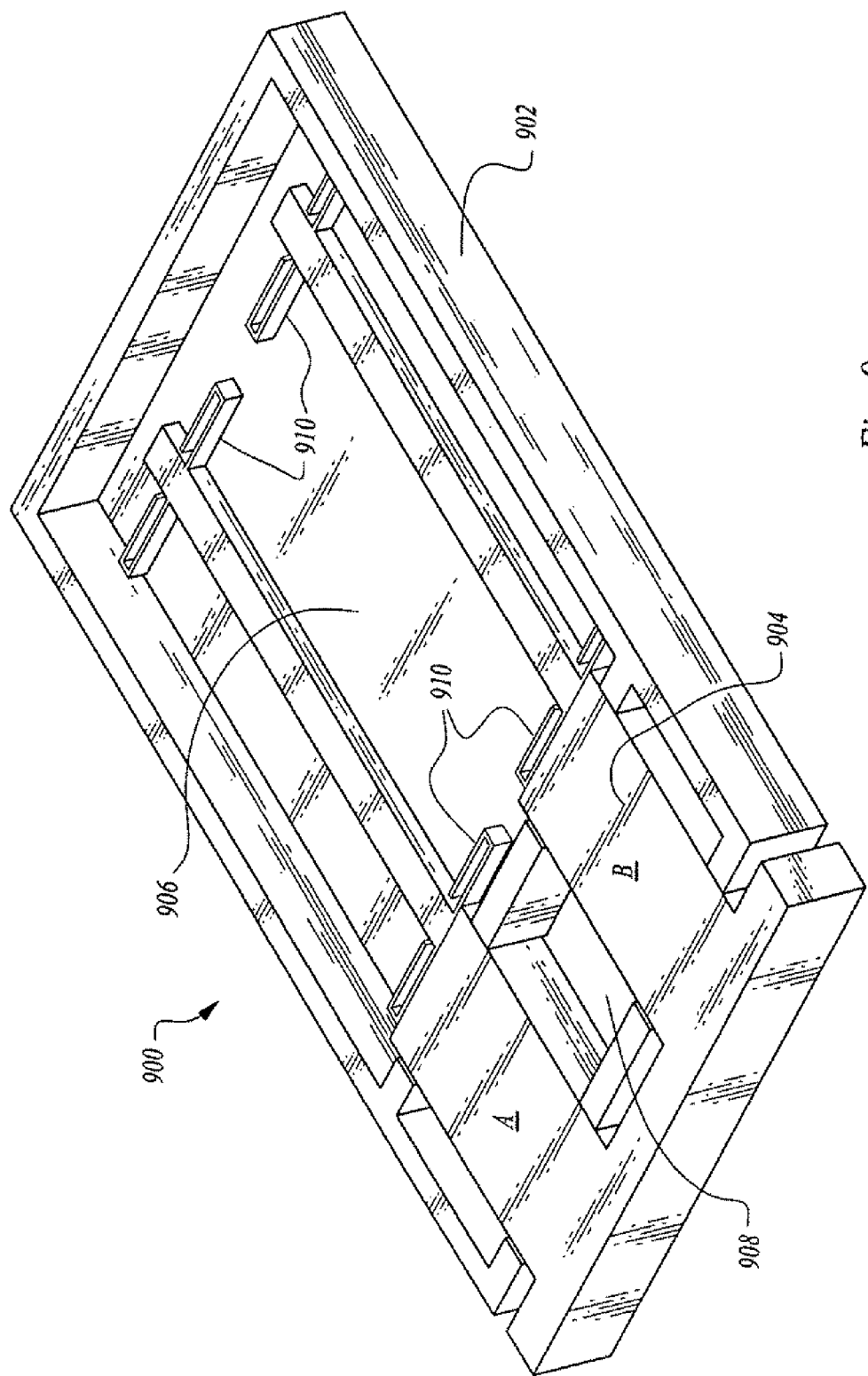
FIG. 9 depicts a diagrammatic perspective view of a piezohydraulic actuator with a moving shuttle and viscous material seal, in accordance with a further embodiment of the present disclosure.

FIG. 9 depicts a perspective view of a piezohydraulic actuator 900 with a moving shuttle and viscous material seal, with lid and piezo disk removed, in accordance with a further embodiment of the present disclosure. Actuator 900 includes a housing 902 a shuttle 904 that has two piston portions A and B. Housing 902 can be configured as shown to provide a hydraulic chamber 906 and a sealing chamber 908 suitable for holding a viscous material, e.g., fluid. Actuator 900 can also include flexures 910 (shown simplified in FIG. 9), similar to those of FIG. 7.

While the previous description of the embodiments of FIGS. 5-9 have been directed to embodiments of stand-alone piezohydraulic linear actuators, piezohydraulic actuator according to the present disclosure can of course be integrated into a final device being actuated by applying the hydraulic pressure waves directly on the end-actuated feature. This may produce simpler system designs and a reduction in the overall mass of moving parts which will improve the dynamic performance and allow higher operation frequencies.

Figure 10:
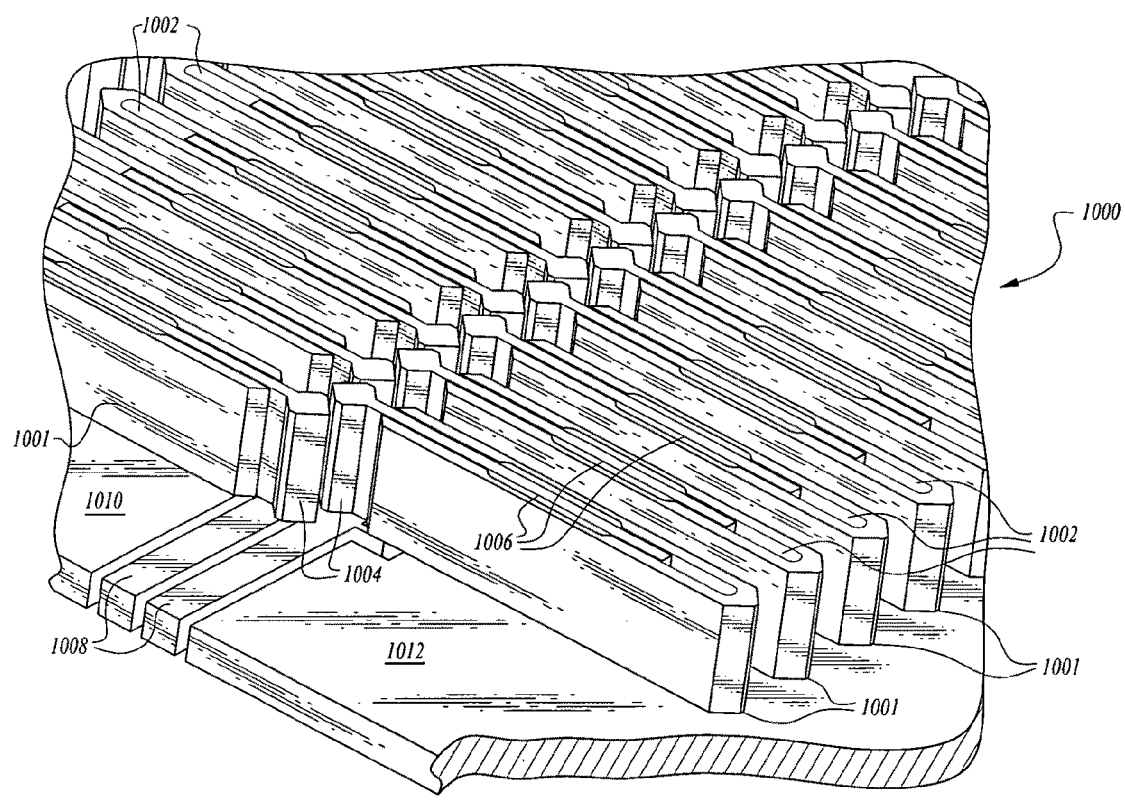
FIG. 10 depicts a diagrammatic perspective view of an integrated actuator micropump design, in accordance with a further embodiment of the present disclosure.

FIG. 10 depicts a perspective view of an integrated actuator micropump 1000, in accordance with a further embodiment of the present disclosure. As shown, micropump 1000 can include a multiple housings 1001 forming pressure chambers 1002. Each pressure chamber 1002 can receive a hydraulic fluid. The fluid can be subject to pressure control by a piezo disk actuator (not shown), e.g., similar to those shown for FIGS. 5-6. Each pressure chamber 1002 can accordingly control a corresponding pump rib 1004. The movement of the ribs 1004 so produced can be utilized, e.g., for fluid pumping/cooling. The pump 1000 can also include housing portions 1010 and 1012 and flexures 1008 as shown.

Figure 11:
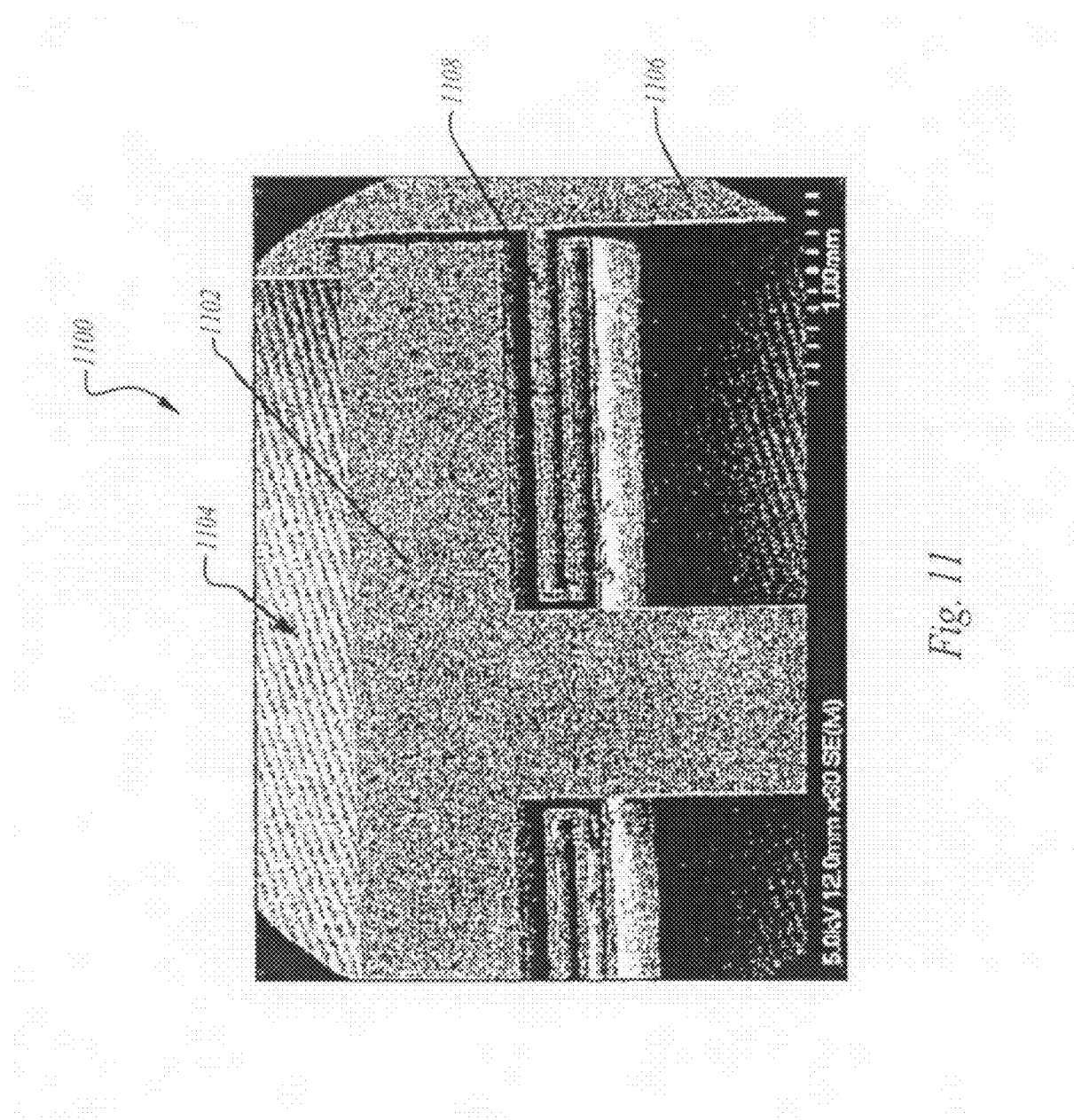
FIG. 11 depicts a scanning electron micrograph of an embodiment of a piezohydraulic actuator, in accordance with an exemplary embodiment of the present disclosure.

FIG. 11 depicts a scanning electron micrograph of an embodiment of a piezohydraulic actuator shuttle layer 1100, in accordance with an exemplary embodiment of the present disclosure. The actuator can include a shuttle/piston 1102 suitable for moving fluid in a reservoir, represented by area 1104. The actuator shuttle layer includes a housing 1106 and flexures 1108. The layer shown was formed by a deep reactive ion etch ("DRIE") process on a 500μ thick silicon wafer.

Testing design embodiments of piezohydraulic actuators according to the present disclosure include a bulk piezo disk from Piezo Systems Inc. (T216-A4NO-273X having 2.4 N blocking force and 19μ zero-load center deflection) mounted on a stainless steel foil over a sealed hydraulic chamber. Calculated operation parameters for the embodiment are 200μ p-p stroke and 76 E-3N force.

While certain embodiments have been described herein, it will be understood by one skilled in the art that the methods and treatments of the present disclosure may be embodied in other specific forms without departing from the spirit thereof. For example, while embodiments of FVPGs have been described in the context of using air as an input fluid, the use of other gases or suitable liquids are within the scope of the present disclosure. For further example, while generators of the present disclosure have been described in the context of including an internal piezo membrane for pressure modulation, external pressure modulation may be utilized according to embodiments of the present disclosure. Additionally, while linear actuators have been described herein in the context of including a piezo membrane for causing hydraulic actuation (pressure modulation of a hydraulic fluid), in alternative embodiments, suitable electromagnetic or electrostatic actuating elements/actuators can be utilized.

Accordingly, the embodiments described herein, and as claimed in the attached claims, are to be considered in all respects as illustrative of the present disclosure and not restrictive.

What is claimed is:

1. A piezoelectric generator comprising:
a plurality of piezoelectric cantilevers configured to bend in response to a flowing fluid; and
a device configured to modulate a pressure of a fluid flowing toward the plurality of piezoelectric cantilevers;
wherein the plurality of piezoelectric cantilevers and the device are configured to direct the fluid to the plurality of piezoelectric cantilevers in a radial direction.

2. The piezoelectric generator of claim 1, wherein each of the plurality of piezoelectric cantilevers comprises at least one material selected from the group consisting of zinc oxide, barium titanite, lead zirconate titanate, lead lanthanum zirconate titanate, lead magnesium niobate, potassium niobate, potassium sodium niobate, potassium tantalite niobate, or piezoelectric polymers.

3. The piezoelectric generator of claim 1, wherein the fluid is a gas.

4. The piezoelectric generator of claim 1, wherein the fluid is a liquid.

5. The piezoelectric generator of claim 1, further comprising an intake plate that includes an aperture.

6. The piezoelectric generator of claim 1, further comprising an exhaust plate that includes an exhaust port.

7. The piezoelectric generator of claim 1, wherein the plurality of piezoelectric cantilevers are arranged as a concentric array.

8. The piezoelectric generator of claim 1, wherein the device comprises a piezoelectric membrane.

9. A piezoelectric generator comprising:
a plurality of piezoelectric cantilevers configured to bend in response to a flowing fluid; and
a device configured to modulate a pressure of a fluid flowing toward the plurality of piezoelectric cantilevers, wherein the device includes a piezoelectric membrane configured to seal against an aperture of an intake plate.

10. The piezoelectric generator of claim 1, wherein the plurality of piezoelectric cantilevers and the device are located on a generator plate.

11. The piezoelectric generator of claim 10, wherein each of the plurality of piezoelectric cantilevers is defined by a gap configured to allow the fluid to pass and wherein each piezoelectric cantilever is configured such that bending of the cantilever produces a voltage.

12. The piezoelectric generator of claim 1, wherein the plurality of piezoelectric cantilevers and the device are microelectromechanical systems.

13. The piezoelectric generator of claim 1, wherein each piezoelectric cantilever comprises a proof mass.

14. A piezoelectric generator system comprising:
a plurality of piezoelectric generator modules, each piezoelectric generator module including a plurality of piezoelectric cantilevers and a fluid pressure modulator configured to modulate the flow of a fluid over the plurality of piezoelectric cantilevers; and
a throttle configured to regulate the amount of fluid available to each of the plurality of piezoelectric generator modules.

15. The piezoelectric generator system of claim 14, wherein each of the plurality of piezoelectric cantilevers comprises at least one material selected from the group consisting of zinc oxide, barium titanite, lead zirconate titanate, lead lanthanum zirconate titanate, lead magnesium niobate, potassium niobate, potassium sodium niobate, potassium tantalite niobate, or piezoelectric polymers.

16. The piezoelectric generator of system of claim 14, wherein the fluid is a gas.

17. The piezoelectric generator system of claim 14, wherein each of the plurality of piezoelectric generator modules further comprises an intake plate that includes an aperture and an exhaust plate that includes an exhaust port.

18. The piezoelectric generator of system of claim 14, wherein the throttle comprises a throttle piston and a throttle cylinder connected to each aperture of each intake plate of each of the plurality of piezoelectric generator modules, wherein the throttle piston is configured to move in the throttle cylinder.

19. The piezoelectric generator system of claim 14, wherein the fluid pressure modulator comprises a piezoelectric membrane configured to seal against an intake aperture.

20. The piezoelectric generator system of claim 14, wherein each of the plurality of piezoelectric cantilevers of each of the plurality of piezoelectric generator modules is defined by a gap configured to allow the fluid to pass and to allow each piezoelectric cantilever to bend in response to the fluid.

21. The piezoelectric generator system of claim 14, wherein the plurality of piezoelectric cantilevers of each of the plurality of piezoelectric generator modules is arranged as a concentric array, and wherein the plurality of piezoelectric cantilevers and the fluid pressure modulator of each of the plurality of piezoelectric generator modules are configured to direct the fluid to the plurality of piezoelectric cantilevers in a radial direction.

22. A piezoelectric generator comprising:
a plurality of piezoelectric cantilevers arranged in a concentric array; and
a device configured to direct a fluid to the plurality of piezoelectric cantilevers, wherein the plurality of piezoelectric cantilevers are configured to move in response to the fluid.

23. The piezoelectric generator of claim 22, wherein at least one of the plurality of piezoelectric cantilevers comprises at least one material selected from the group consisting of zinc oxide, barium titanite, lead zirconate titanate, lead lanthanum zirconate titanate, lead magnesium niobate, potassium niobate, potassium sodium niobate, potassium tantalite niobate, or piezoelectric polymers.

24. The piezoelectric generator of claim 22, wherein the fluid is a gas.

25. The piezoelectric generator of claim 22, wherein at least one of the plurality of piezoelectric cantilevers is defined by a gap configured to allow the fluid to pass after the at least one piezoelectric cantilever moves in response to the fluid.

26. The piezoelectric generator of claim 22, wherein the device is configured to modulate flow of the fluid.

27. A method of operating a generator comprising:
providing a pressurized fluid; and
modulating the flow of the pressurized fluid over a plurality of piezoelectric cantilevers, wherein said modulating the flow of the pressurized fluid comprises directing the pressurized fluid in a radial direction.

28. The method of claim 27, wherein the plurality of piezoelectric cantilevers are configured to generate electricity.

29. The method of claim 27, wherein said modulating the flow of the pressurized fluid comprises deflecting a piezoelectric membrane.

30. The method of claim 27, wherein each of the plurality of piezoelectric cantilevers comprises at least one material selected from the group consisting of zinc oxide, barium titanite, lead zirconate titanate, lead lanthanum zirconate titanate, lead magnesium niobate, potassium niobate, potassium sodium niobate, potassium tantalite niobate, or piezoelectric polymers.

31. The method of claim 27, wherein the pressurized fluid is a gas.

32. A method of operating a generator comprising:
providing a pressurized fluid;
modulating the flow of the pressurized fluid over a plurality of piezoelectric cantilevers; and
regulating the pressurized fluid using a throttle.

33. A method of operating a generator comprising:
directing a fluid to a plurality of piezoelectric cantilevers arranged in a concentric array, wherein the plurality of piezoelectric cantilevers are configured to bend in response to the fluid.

34. The method of claim 33, wherein said directing the fluid to the at least one piezoelectric cantilever comprises modulating the flow of the fluid over the at least one piezoelectric cantilever.

35. The method of claim 34, wherein said modulating comprises controlling a flow of the fluid using a valve.

36. The method of claim 33, wherein the fluid is a gas.

37. The method of claim 33, wherein the at least one piezoelectric cantilever is configured to generate electricity.

* * * * *

UNITED STATES PATENT AND TRADEMARK OFFICE
CERTIFICATE OF CORRECTION

PATENT NO. : 8,040,022 B2  Page 1 of 1
APPLICATION NO. : 12/334383
DATED : October 18, 2011
INVENTOR(S) : Sapir It is certified that error appears in the above-identified patent and that said Letters Patent is hereby corrected as shown below:

Column 10, line 60, in Claim 16, delete "of system" and insert -- system --.

Column 10, line 66, in Claim 18, delete "of system" and insert -- system --.

Signed and Sealed this
Third Day of July, 2012

David J. Kappos
*Director of the United States Patent and Trademark Office*